United States Patent
Yamada et al.

(10) Patent No.: US 8,459,202 B2
(45) Date of Patent: Jun. 11, 2013

(54) SUBSTRATE PROCESSING APPARATUS

(75) Inventors: Tomoyuki Yamada, Toyama (JP); Mamoru Oishi, Toyama (JP); Kanako Kitayama, Toyama (JP)

(73) Assignee: Hitachi Kokusai Electronics Inc., Tokyo (JP)

( * ) Notice: Subject to any disclaimer, the term of this patent is extended or adjusted under 35 U.S.C. 154(b) by 793 days.

(21) Appl. No.: 12/568,175

(22) Filed: Sep. 28, 2009

(65) Prior Publication Data
US 2010/0078128 A1 Apr. 1, 2010

(30) Foreign Application Priority Data

Sep. 29, 2008 (JP) ................................. 2008-250863
Aug. 27, 2009 (JP) ................................. 2009-197151

(51) Int. Cl.
*C23C 16/00* (2006.01)
*C23C 16/52* (2006.01)
*H01L 21/306* (2006.01)
*G06F 19/00* (2006.01)
*G01F 15/00* (2006.01)
*G01F 15/06* (2006.01)

(52) U.S. Cl.
USPC ........... 118/696; 118/697; 118/707; 118/708; 118/710; 118/712; 118/715; 156/345.26; 700/121; 116/200; 116/201; 116/202; 116/264; 116/277; 137/825; 137/829; 137/831; 137/832; 137/561 R; 137/613

(58) Field of Classification Search
USPC ................. 118/712, 715, 708, 710, 707, 696; 156/345.26; 700/121; 116/200, 201, 202, 116/264, 277; 137/825, 829, 831, 832, 561 R, 137/613
See application file for complete search history.

(56) References Cited

U.S. PATENT DOCUMENTS

| | | | | |
|---|---|---|---|---|
| 2,566,873 A * | 9/1951 | Britton | ........................... | 137/255 |
| 2,951,638 A * | 9/1960 | Hughes et al. | ..................... | 703/9 |
| 4,562,552 A * | 12/1985 | Miyaoka et al. | .............. | 700/283 |
| 6,778,873 B1 * | 8/2004 | Wang et al. | .................... | 700/110 |
| 7,638,001 B2 * | 12/2009 | Kawamura | ..................... | 118/692 |
| 8,122,848 B2 * | 2/2012 | Kawamura | ..................... | 118/666 |
| 2002/0148561 A1 * | 10/2002 | Tetsuhiro et al. | ......... | 156/345.26 |
| 2004/0261705 A1 * | 12/2004 | Kang et al. | ..................... | 118/715 |
| 2005/0071034 A1 * | 3/2005 | Mitrovic | ........................ | 700/121 |
| 2005/0071035 A1 * | 3/2005 | Strang | ............................ | 700/121 |
| 2005/0071036 A1 * | 3/2005 | Mitrovic | ........................ | 700/121 |
| 2005/0071037 A1 * | 3/2005 | Strang | ............................ | 700/121 |
| 2005/0071038 A1 * | 3/2005 | Strang | ............................ | 700/121 |
| 2005/0071039 A1 * | 3/2005 | Mitrovic | ........................ | 700/121 |

(Continued)

FOREIGN PATENT DOCUMENTS

| JP | 2002-025918 | 1/2002 |
|---|---|---|
| JP | 200266364 | 3/2002 |
| JP | 2003177037 | 6/2003 |

*Primary Examiner* — Jeffrie R Lund
(74) *Attorney, Agent, or Firm* — Brundidge & Stanger, P.C.

(57) ABSTRACT

A gas flow of a gas pipe is indicated before an electromagnetic valve is actually opened, so that the electromagnetic valve can be prevented from being opened or closed by a wrong manipulation or hazards caused by undesired mixing of gases can be avoided so as to improve safety. The substrate processing apparatus includes a state detection unit configured to detect an opening/closing request state and an opening/closing state of a valve installed at a gas pipeline; and a indication unit configured to indicate a gas flow state of the gas pipeline predicted according to the opening/closing request state and a gas flow state of the gas pipeline when the valve is opened, in a way that each state is distinguished.

18 Claims, 12 Drawing Sheets

U.S. PATENT DOCUMENTS

2009/0211525 A1* 8/2009 Sarigiannis et al. .......... 118/707
2009/0214777 A1* 8/2009 Sarigiannis et al. ....... 427/248.1
2009/0214778 A1* 8/2009 Sarigiannis et al. ....... 427/248.1
2010/0078128 A1* 4/2010 Yamada et al. .......... 156/345.26
2011/0201210 A1* 8/2011 Sato et al. ..................... 438/770
2012/0048467 A1* 3/2012 Mahadeswaraswamy et al. ........................ 156/345.27

* cited by examiner

THIS VALVE CANNOT BE OPENED DUE TO INTERLOCK.
PLEASE CHECK IF A VALVE THAT CANNOT BE OPENED
TOGETHER WITH THIS VALVE IS OPENED.

SUBSTRATE PROCESSING APPARATUS

CROSS-REFERENCE TO RELATED PATENT APPLICATION

This U.S. non-provisional patent application claims priority under 35 U.S.C. §119 of Japanese Patent Application Nos. 2008-250863, filed on Sep. 29, 2008, and 2009-197151, filed Aug. 27, 2009, in the Japanese Patent Office, the entire contents of which are hereby incorporated by reference.

BACKGROUND OF THE INVENTION

1. Field of the Invention

The present invention relates to a substrate processing apparatus configured to perform a variety of processes such as an oxidation process, a diffusion process, and a thin film forming process on a substrate such as a wafer, and more particularly, to a substrate processing apparatus capable of displaying the state of gas flow in a gas pipe.

2. Description of the Prior Art

A substrate processing apparatus includes an airtight process chamber and is used to manufacture a semiconductor device by performing a process such as a pattern forming process on a wafer by supplying various gases to the process chamber to form a thin film on the wafer or supplying etch gas to the process chamber to etch the thin film.

Therefore, numbers of systems of gas supply lines and an exhaust system are connected to the process chamber of the substrate processing apparatus.

In addition, the substrate processing apparatus includes a control unit configured to control the gas supply lines and the exhaust system, and an indication unit equipped manipulation unit configured to indicate wafer processing states of the process chamber or gas supply states of the gas supply lines and the exhaust system.

Informations such as wafer processing states, pressure detection states of pressure gauges, flow detection states of flow controllers, and operation states of electromagnetic valves are sent from the control unit to the indication unit.

The plurality of gas supply lines are connected to the process chamber, and gas supply electromagnetic valves and interlock electromagnetic valves are closed or opened according to processing states under the control of the control unit, or by manipulating the indication unit.

In addition, the indication unit includes a gas monitoring indication unit configured to indicate gas supply states, and the indication unit is configured to indicate opening/closing states of the electromagnetic valves of the respective gas supply lines, and the indication unit is configured to inform that gas is supplied to the process chamber from which of gas pipes.

In addition, electromagnetic valves used to control flows of gases, where danger is caused by mixture, are controlled by an interlock operation of a central processing unit (CPU) of the control unit so as to prevent simultaneous opening of the electromagnetic valves.

As explained above, in the conventional substrate processing apparatus, flow states of the respective gas supply lines can be known from opening/closing states of the electromagnetic valves and flow detection results by the flow controllers.

That is, as shown in FIG. 8, a gas supply electromagnetic valve 2 and an interlock electromagnetic valve 3 are sequentially placed from the upstream side of a gas pipe 1. Gas is supplied to a section (a) flows to sections (b) and (c) through a regulator 4, and if the gas supply electromagnetic valve 2 is opened, the gas flows to a section (d). In this state, if a flow controller (Mass Flow Controller, MFC) 5 is controlled, the gas reaches a section (e), and then the gas flows to a section (f) in the same sequence.

If the electromagnetic valves 2 and 3 are opened simultaneously or sequentially from the upstream side, gas can be supplied to a tube (or process chamber) as intended. However, if it is forgotten whether the electromagnetic valves 2 and 3 are opened and the MFC 5 is controlled, it cannot be known whether gas flows to the tube. That is, only after the electromagnetic valves 2 and 3 are actually opened, the gas state of the gas pipe 1 can be ascertained.

Therefore, in the conventional art, since only the state of arriving gas is indicated, it cannot be known how gas flows in a pipe before an electromagnetic valve is opened.

In addition, since toxic or flammable gas is often used in a semiconductor manufacturing process, it may be dangerous to the human body if such gas is carelessly supplied, and a substrate processing process may be greatly affected if gas does not flow through an intended passage.

[Patent Document 1]
Japanese Unexamined Patent Application Publication No. 2002-25918

SUMMARY OF THE INVENTION

An object of the present invention is to provide a substrate processing apparatus, in which a gas flow of a gas pipe is indicated before an electromagnetic valve is actually opened so that the substrate processing apparatus can be prevented from forgetting the opening/closing of the electromagnetic valves due to a wrong manipulation or hazards caused by undesired mixing of gases can be prevented so as to improve safety.

According to an aspect of the present invention, there is provided a substrate processing apparatus including a control device configured to: detect an opening/closing request state and an opening/closing state of a valve disposed at a gas pipeline; perform a simulation for predicting a state of a gas flowing through the gas pipeline by the opening/closing request state of the valve; and distinguishably display a state of the gas flowing through the gas pipeline by opening the valve and the state of the gas predicted by the simulation when an open state is detected from the opening/closing request state.

The substrate processing apparatus may further include a gas detection unit configured to detect gas from an inside of the gas pipeline, wherein the indication unit may be configured to indicate a gas flow of the gas pipeline detected by the gas detection unit. The substrate processing apparatus may further include a flow detection unit configured to detect a flow of gas flowing through the gas pipeline, wherein the indication unit is configured to indicate the flow of gas detected by the flow detection unit.

BRIEF DESCRIPTION OF THE DRAWINGS

FIG. 10 is a diagram illustrating an example of an alert window according to the fourth embodiment of the present invention.

DETAILED DESCRIPTION OF THE PREFERRED EMBODIMENTS

Embodiments of the present invention will be described hereinafter with reference to the attached drawings.

Figure 1:
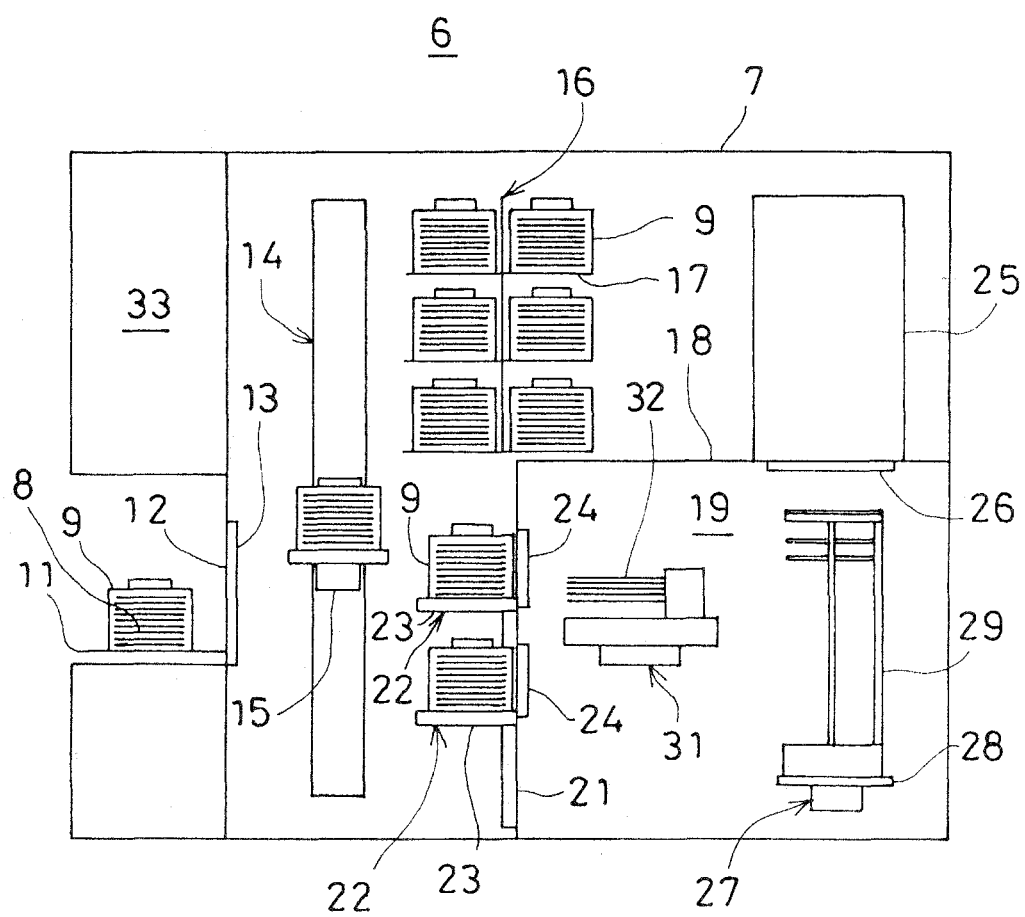
FIG. 1 is a vertical sectional diagram schematically illustrating a substrate processing apparatus according to the present invention.

First, with reference to FIG. 1, a substrate processing apparatus will be schematically described according to the present invention.

In FIG. 1, reference numeral 6 denotes a substrate processing apparatus, and reference numeral 7 denotes a housing. Wafers 8 are loaded into and unloaded from the substrate processing apparatus 6 in a state where the wafers 8 are accommodated in a substrate carrying container. For example, pods 9 are used as substrate carrying containers, and a predetermined number of wafers 8, for example, twenty five wafers 8 can be accommodated in each pod 9. The pods 9 are airtight containers each equipped with an openable cover, and wafers 8 are charged into and discharged from the pod 9 after opening the cover.

At the front side of the substrate processing apparatus 6, a substrate stage 11 is installed, and a pod 9 is loaded onto the substrate stage 11 and unloaded from the substrate stage 11 by an external carrying device (not shown).

At a part of the housing 7 corresponding to the substrate stage 11, a pod carrying port 12 is installed, and a front shutter 13 is installed to close and open the pod carrying port 12, so that a pod 9 can be loaded into and unloaded from the housing 7 through the front shutter 13.

At the front inner part of the housing 7, a pod carrying device 14 is installed, which includes a pod transfer arm 15 capable of holding a pod 9. The pod transfer arm 15 is movable in vertical, transversal (vertical to the plane of the paper in FIG. 1), forward, and backward (left and right in the plane of the paper in FIG. 1) directions, so that a pod 9 can be moved to any position by associative vertical, transversal, forward, and backward motions of the pod transfer arm 15.

At an upper inner part of the housing 7 facing the pod carrying device 14, a pod storage part 16 is installed. The pod storage part 16 includes a plurality of storage shelves 17 that can be intermittently rotated, and a plurality of pods 9 can be stored on each of the storage shelves 17.

At a lower rear part of the inside of the housing 7, a sub housing 18 is installed to define a transfer chamber 19.

At a front wall 21 of the sub housing 18, pod openers 22 are vertically installed in two stages. Each of the pod openers 22 includes a placement board 23 and a cover opening/closing mechanism 24, and is configured so that a pod 9 can be placed on the placement board 23 and brought into contact with the front wall 21 for opening and closing the cover of the pod 9 by using the cover opening/closing mechanism 24. When the cover of the pod 9 is opened, the inside of the pod 9 communicates with the inside of the transfer chamber 19.

At a rear inner part of the housing 7 located above the sub housing 18, a process furnace 25 is erected. The process furnace 25 includes a reaction tube that defines a hermetical process chamber, and a heater installed around the reaction tube. In addition, gas supply lines and an exhaust line are connected to the reaction tube, so that process gases can be supplied and exhausted while heating the process chamber and keeping the process chamber at a predetermined process pressure.

The process chamber includes a furnace port at its bottom side to communicate with the transfer chamber 19, and the furnace port can be closed and opened by handling a furnace port shutter 26.

At the transfer chamber 19, a boat elevator 27 is installed under the process furnace 25, and the boat elevator 27 includes a seal cap 28 that can be used to close the furnace port hermetically. A boat 29 can be placed on the seal cap 28, and the boat elevator 27 can lift the seal cap 28 so as to load the boat 29 into the process chamber. In addition, when the boat 29 is loaded in the process chamber, the seal cap 28 closes the furnace port hermetically.

At the transfer chamber 19, a substrate transfer machine 31 is installed between the pod openers 22 and the boat elevator 27, and the substrate transfer machine 31 includes a plurality of substrate holding plates (tweezers) 32 capable of holding wafers 8. For example, five tweezers 32 are vertically arranged with the same pitch. The pitch of the tweezers 32 is equal to the wafer accommodation pitch of the pod 9 and the wafer hold pitch of the boat 29.

The substrate transfer machine 31 is configured to move the tweezers 32 horizontally in forward and backward directions, and to move the tweezers 32 vertically and rotate the tweezers 32 about a vertical axis, so that wafers 8 can be held on the tweezers 32 and transferred to predetermined positions by forward, backward, rotation, and vertical motions of the substrate transfer machine 31.

The substrate processing apparatus 6 includes a flow control unit 43 (described later), and a control device 33 including a manipulation unit 44 equipped with indication unit. For example, the control device 33 is disposed at the front side of the substrate processing apparatus 6. The control device 33 controls driving mechanisms of the pod carrying device 14, the pod storage part 16, the cover opening/closing mechanisms 24, the boat elevator 27, the substrate transfer machine 31, and so on. In addition, the control device 33 controls the heating states of the process furnace 25.

Figure 8:
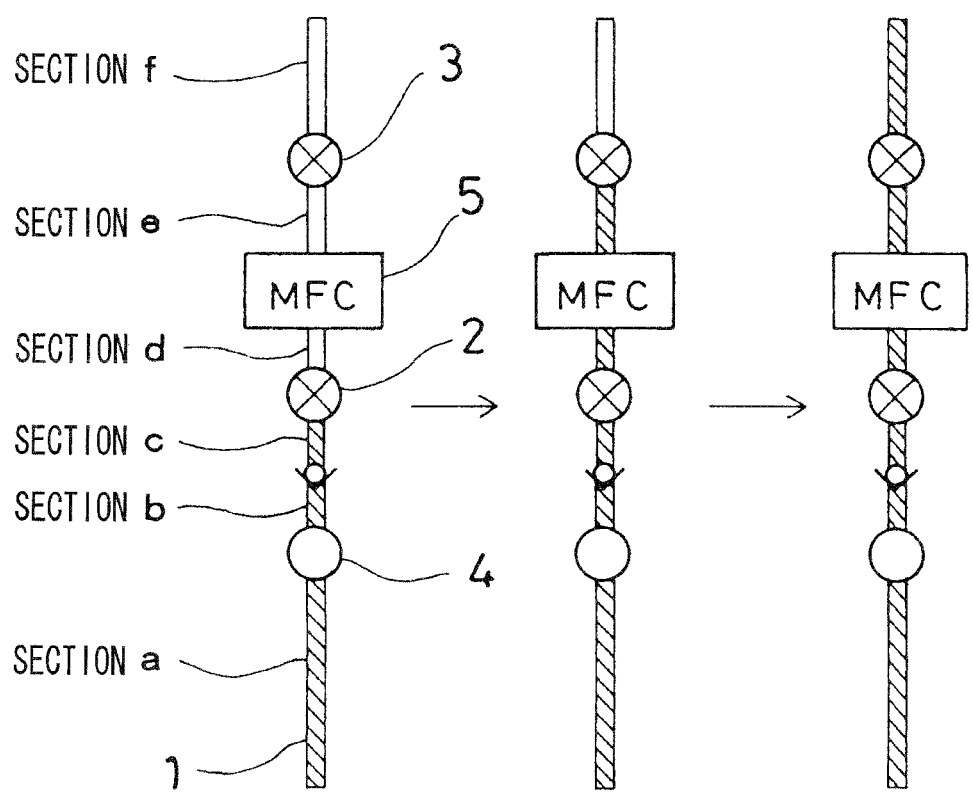
FIG. 8 is a diagram illustrating a display example of the conventional art.

Next, with reference to FIG. 2 to FIG. 5B, a first embodiment of the present invention will be described. In FIG. 2, FIG. 3, and FIG. 5A and FIG. 5B, the same elements as those illustrated in FIG. 1 and FIG. 8 will be denoted by the same reference numerals, and descriptions thereof will not be repeated.

A plurality of gas pipes 1A to 1C and an exhaust system 35 are connected to a process chamber 34 of the substrate processing apparatus 6 as gas pipelines configured to supply $N_2$ gas and process gases (used for a substrate processing process such as a thin film forming process or an etching process); and a hand valve 36 used to interrupt gas supply, a regulator 4 used to regulate pressure, a pressure transducer (PT) 37, a gas supply electromagnetic valve 2, a substitution electromagnetic valve 38, a flow controller 5, an interlock electromagnetic valve 3, a check valve 39, and a check valve 41 are placed at each of the gas pipes 1A to 1C; and a vacuum pump 42 is placed at the exhaust system 35. In addition, each of the gas pipes 1B and 1C configured to supply process gas is divided into two branches on the downstream side of the flow controller 5, and an interlock electromagnetic valve 3 is placed at each of the branches. One of the branches is connected to the process chamber 34, and the other is connected to the exhaust system 35. Here, each of the gas pipelines is configured by a plurality of pipe elements which are combined as a passage through which gas flows from a gas supply source (gas tank) to the process chamber 34.

The flow control unit 43 includes a central processing unit (CPU) and a memory unit. The memory unit stores programs such as a control program and a determination program, and data such as various parameters. The flow control unit 43 is connected to the manipulation unit 44 equipped with indication unit, and all devices such as the gas supply electromagnetic valves 2, the interlock electromagnetic valves 3, and the vacuum pump 42 are connected to the flow control unit 43 through input/output ports. Here, the determination program is a simulation program used to perform simulations according to the present invention.

Informations about wafer processing states, pressure detection states of the pressure gauges 37, and flow detection states of the flow controllers 5 functioning as flow detection units are sent from the flow control unit 43 to the manipulation unit 44 equipped with indication unit. In addition, signals containing information such as operational states of the gas supply electromagnetic valves 2, the interlock electromagnetic valves 3, and the substitution electromagnetic valves 38 are sent from the flow control unit 43 to the manipulation unit 44 equipped with indication unit, and the manipulation unit 44 equipped with indication unit functions as a valve state detection unit. Opening and closing operations of the gas supply electromagnetic valves 2 and the interlock electromagnetic valves 3, and flow controlling operations of the flow controllers 5 are controlled by the flow control unit 43. In addition, the manipulation unit 44 equipped with indication unit functions as a voice output unit and a state change unit.

In the above description, states of the respective valves are detected by using signals sent from the valves to the manipulation unit 44 equipped with indication unit. However, sensors can be directly placed at the respective valves to detect opening and closing operations of the valves: that is, the sensors can be used as valve state detection units.

The flow control unit 43 is configured to control supply and exhaust operations of the gas pipes 1 and the exhaust system 35, and the manipulation unit 44 equipped with indication unit is configured to indicate processing states of the process chamber 34 or gas supply and exhaust states of the gas pipes 1 and the exhaust system 35.

In addition, the manipulation unit 44 equipped with indication unit includes a gas monitoring indication unit configured to display gas supply and exhaust states, and the gas monitoring indication unit displays opening/closing states of devices such as the electromagnetic valves of the respective gas pipes 1, so that it can be known that gas is supplied to the process chamber 34 through which of the gas pipes 1.

Next, an explanation will be given on how the states inside the respective gas pipes 1 are displayed.

Figure 2:
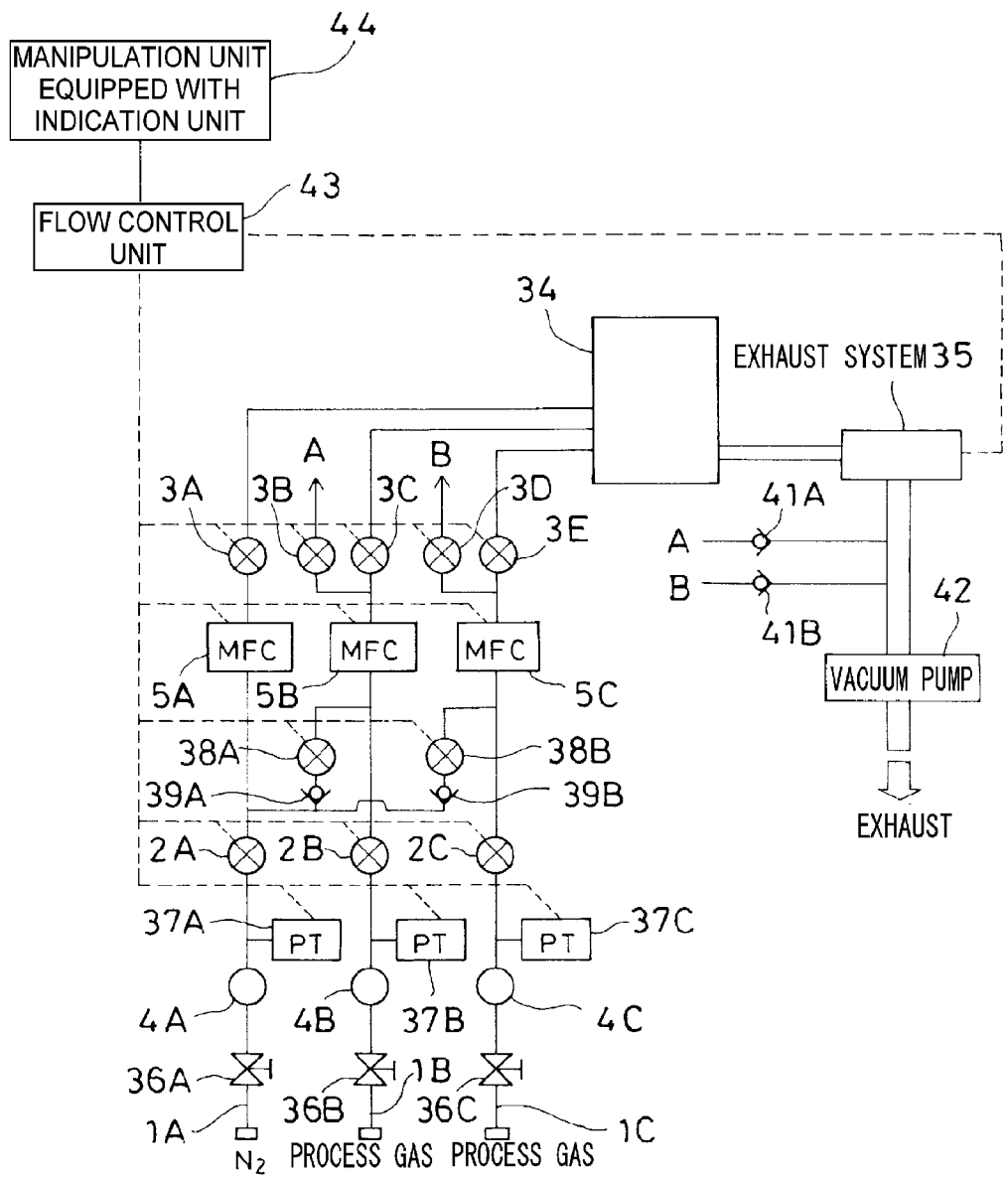
FIG. 2 is a block diagram illustrating a structure of the present invention.
Figure 3:
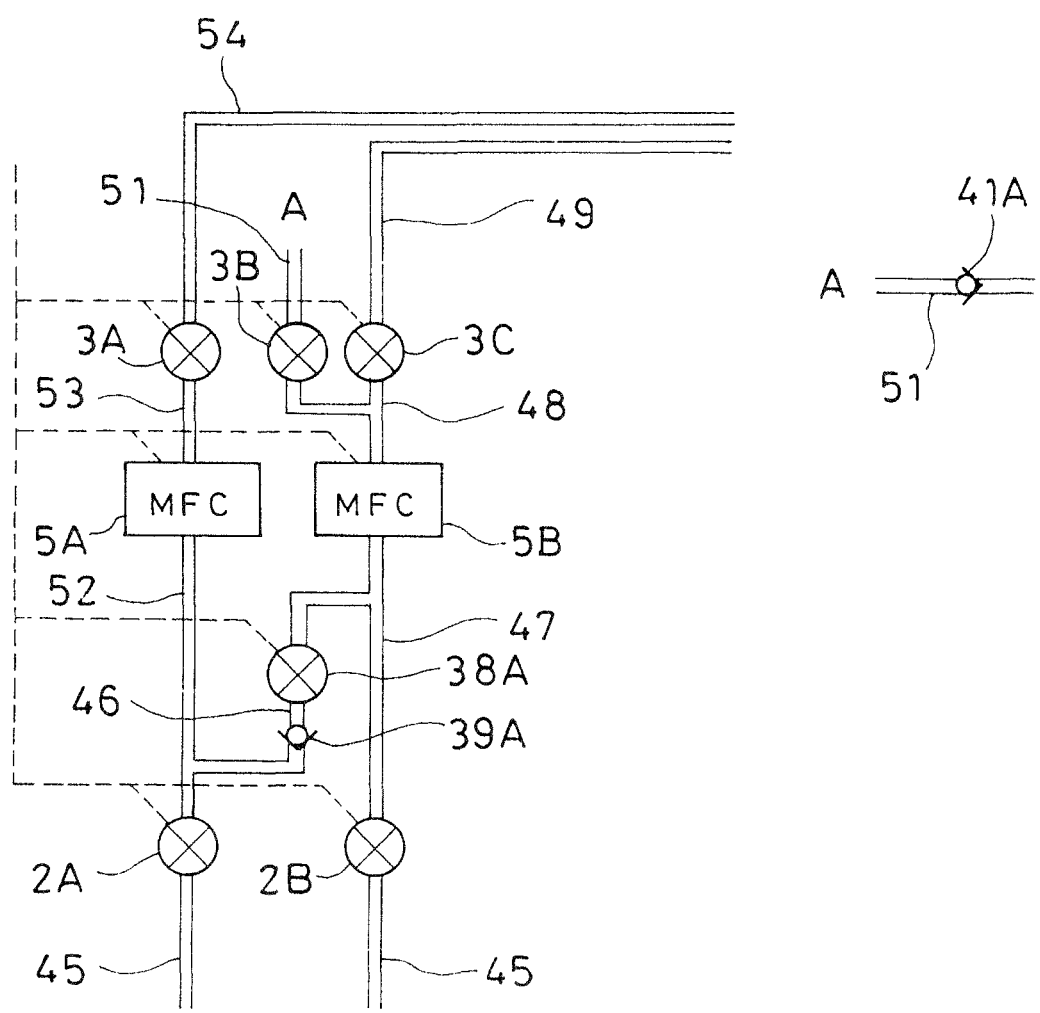
FIG. 3 is an enlarged diagram illustrating main parts of FIG. 2.
Figure 4:
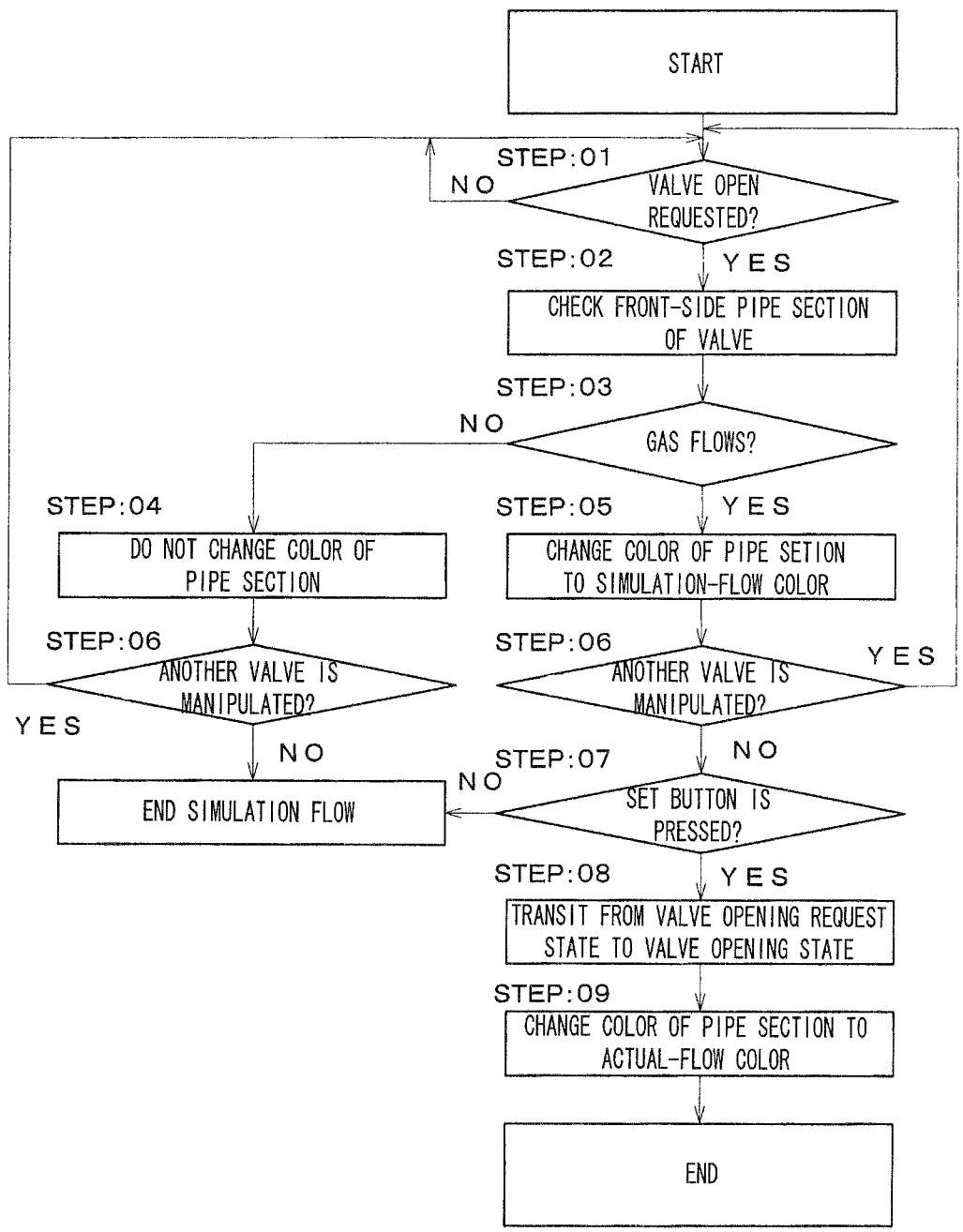
FIG. 4 is a flowchart for explaining an embodiment of the present invention.

FIG. 3 is an enlarged diagram illustrating main parts of FIG. 2, and FIG. 4 is a flowchart of a gas pipe state display program.

Referring to FIG. 3, the gas pipes 1A and 1B includes: pipe sections 45 at the upstream sides of the gas supply electromagnetic valves 2A and 2B; a pipe section 46 between the substitution electromagnetic valve 38A and the check valve 39A; a pipe section 47 among the flow controller 5B, the gas supply electromagnetic valve 2B, and the substitution electromagnetic valve 38A; a pipe section 48 among the flow controller 5B, the interlock electromagnetic valve 3B, and the interlock electromagnetic valve 3C; a pipe section 49 at the downstream side of the interlock electromagnetic valve 3C; a pipe section 51 at the downstream side of the interlock electromagnetic valve 3B; a pipe section 52 among the gas supply electromagnetic valve 2A, the flow controller 5A, and the check valve 39A; a pipe section 53 between the interlock electromagnetic valve 3A and the flow controller 5A; and a pipe section 54 at the downstream side of the interlock electromagnetic valve 3A.

Valve opening/closing conditions are previously set for the gas supply electromagnetic valves 2, the interlock electromagnetic valves 3, the flow controllers 5, and the substitution electromagnetic valves 38. Particularly, the interlock electromagnetic valves 3 are configured to be interlocked if they are handled against the valve opening/closing conditions. Therefore, the determination program is configured to detect gases of the of the front and rear pipe sections in the gas pipes based on the valve opening/closing conditions of the interlock electromagnetic valve 3, and thus the determination program can be used as a gas detection unit. Alternatively, sensors may be installed at the respective pipe sections 45 to 49 and 51 to 54 for detecting gas, and the sensors may be used as gas detection units.

Gas states of the respective pipe sections are simulated by the control device 33. Gas state prediction simulation is started when the manipulation unit 44 equipped with indication unit receives a signal in response to a valve depression or a command signal requesting a valve opening operation. First, the manipulation unit 44 equipped with indication unit determines whether a valve is requested to be opened (STEP: 01). In the determination, if a signal is received in response to depression of the valve, it is checked whether a command signal is included to request opening of the valve.

If it is determined that the valve is requested to be opened, the determination program is executed, and the state of a front-side pipe section of the valve is checked (STEP: 02). Then, it is determined whether gas is filled in the front-side pipe section, and the opening/closing state of a rear-side valve or the state of a rear-side pipe section is checked (STEP: 03).

If gas is not filled in the front-side pipe section of the valve, gas does not flow to the rear-side pipe section of the valve although the valve is opened, and thus a color (non-flow color) indicating that gas is not filled in a pipe section is not changed (STEP: 04).

If gas is filled in the front-side pipe of the valve, gas can flow to the rear-side pipe section of the valve when the valve is opened, and thus the color of the rear-side pipe section is changed to a color (simulation-flow color) indicating a prediction that gas flows to a predetermined pipe section (STEP: 05).

Next, it is determined whether another valve is manipulated (STEP: 06). This determination is carried out while waiting until another valve is manipulated, and if another valve is manipulated, the determination program is executed. In addition, it is determined whether the simulation is stopped. For example, it is determined whether a cancel button displayed on a manipulation screen is touched. After STEP: 04, if it is determined that another valve is not manipulated, the simulation ends, and after STEP: 05, if it is determined that another valve is not manipulated, it is determined whether to open a valve actually, that is, it is determined whether to press a SET button (STEP: 07). If it is determined that another valve is not manipulated in STEP: 06 and the SET button is not pressed in STEP: 07, only the simulation is performed without an actual opening of a valve, and a process is ended. Meanwhile, in STEP: 06, if it is determined that another valve is manipulated, STEP: 01 to STEP: 03 are repeated for the valve.

In the case where a process is performed according to the simulation, the SET button is pressed in STEP: 07. If the SET button is pressed, it is changed from a valve opening request state to a valve opening state by the flow control unit 43 (STEP: 08), and the flow control unit 43 outputs a signal to the manipulation unit 44 equipped with indication unit so as to change the color of the rear-side pipe section of the valve to a preset color (actual-flow color) indicating a state that gas has flown to the rear-side pipe section of the valve (STEP: 09).

Alternatively, instead of performing STEP: 06, the simulation can be performed for each valve.

Figure 5A:
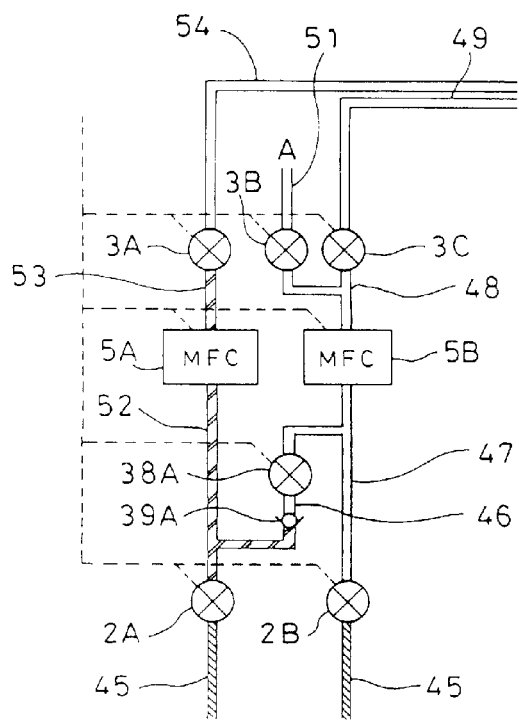
FIG. 5A and FIG. 5B are diagrams illustrating display examples according to a first embodiment of the present invention.
Figure 5B:
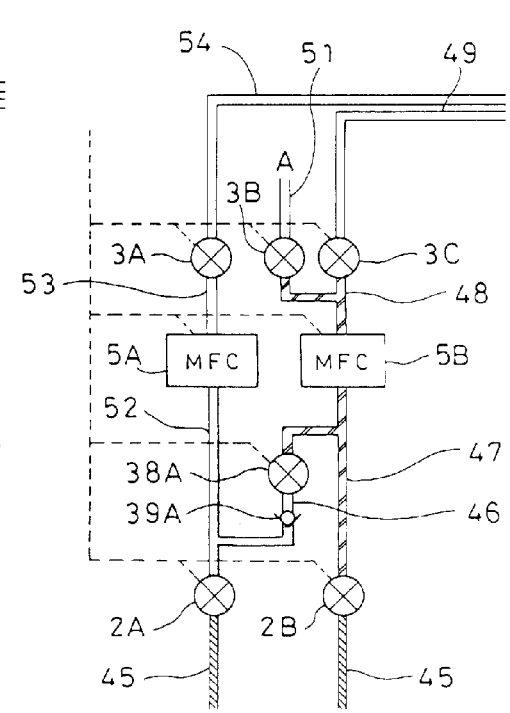

FIG. 5A and FIG. 5B illustrate exemplary output results of the gas pipe state indication program.

Referring to FIG. 5A and FIG. 5B, gas is filled to the gas supply electromagnetic valve 2A and the gas supply electromagnetic valve 2B; and the gas supply electromagnetic valve 2A, the gas supply electromagnetic valve 2B, the interlock electromagnetic valve 3A, the interlock electromagnetic valve 3B, the interlock electromagnetic valve 3C, and the substitution electromagnetic valve 38A are closed.

Referring to FIG. 5A, the manipulation unit 44 equipped with indication unit displays simulation results: the pipe sections 45 is indicated by an actual-flow color (such as red); the pipe sections 47 and 48 are indicated by a simulation-flow color (such as yellow); and the pipe sections 46, 49, 51, 52, 53, and 54 are indicated by a non-flow color (such as gray).

Referring to FIG. 5B, the manipulation unit 44 equipped with indication unit displays similar simulation results: the pipe sections 52 and 53 are indicated by a simulation-flow color; the pipe sections 45 are indicated by an actual-flow color; the pipe sections 46, 47, 48, 49, 51, and 54 are indicated by a non-flow color.

In addition to the color coding of the pipe sections in the embodiment, flowrate states of gas flowing through the gas pipes 1 may be indicated based on flow information detected by the flow controllers 5.

For example, according to the actual gas flow of the gas pipe 1, the flow controller 5 may be indicated by a regulated-flow color (for example, green) when the actual flow equal to a regulated value, an excessive-flow color (for example, red) when the actual flow is greater than the regulated valve, and an insufficient-flow color (for example, blue) when the actual flow is smaller than the regulated valve. By outputting such color information from the flow control unit 43 to the manipulation unit 44 equipped with indication unit, the flow of gas can be easily distinguished.

Instead of indicating the flow of gas by colors as describe above, the flow control unit 43 may output a signal to the manipulation unit 44 equipped with indication unit so as to indicate the flow controller 5 with blinking light and make the gas flow distinguishable by the frequency of the blinking light of the flow controller 5.

Figure 6:
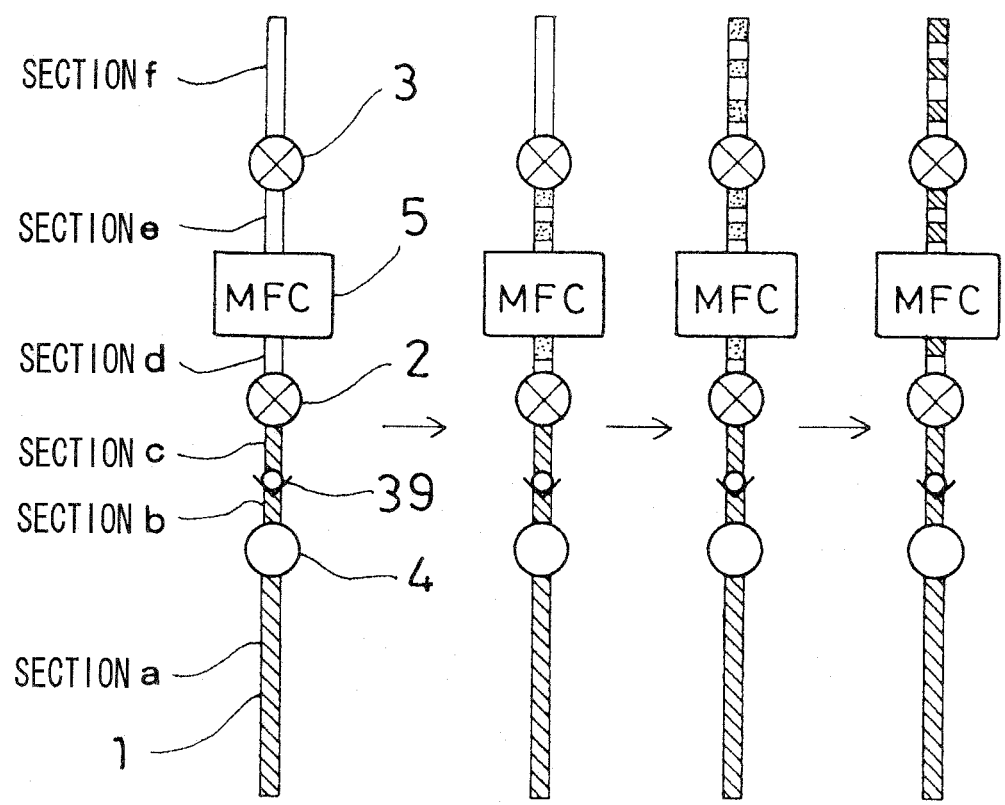
FIG. 6 is a diagram illustrating a display example according to a second embodiment of the present invention.

Next, with reference to FIG. 6, a second embodiment of the present invention will be described. In FIG. 6, the same elements as those illustrated in FIG. 2 will be denoted by the same reference numerals, and descriptions thereof will not be repeated.

The structure of the second embodiment is proposed by simplifying the structure of the first embodiment.

First, gas is filled in sections (b) and (c) through a section (a) and a regulator 4, and the sections (a), (b), and (c) are indicated by a color, for example, red.

So as to supply gas to the process chamber 34, an opening request command is sent from the flow control unit 43 to a gas supply electromagnetic valve 2 to open the gas supply electromagnetic valve 2 of a gas pipe 1.

The determination program provided in the flow control unit 43 is executed to determine whether gas is filled in the front side of the electromagnetic valve 2 to be opened, and if it is determined that gas is filled, the determination program outputs a signal to the manipulation unit 44 equipped with indication unit so as to indicate a section (d) by using a color different from the color used to indicate the sections (a), (b), and (c), for example, by using yellow dots. If it is determined that gas is not filled, the pipe color of the section (d) is not changed, for example, from gray.

At the same time, the determination program is executed in the same way for the front and rear pipe sections of the flow controller 5, and if the flow control unit 43 sends a flow command to the flow controller 5 to make the flow become a predetermined valve, the manipulation unit 44 equipped with indication unit indicates the front and rear pipe sections of the flow controller 5 with a shape, color, and motion different from those used for displaying the sections (a), (b), and (c). The same determination is performed until the process chamber 34 (a section (f)) is reached, and a predicted gas flow state of the gas pipe 1 is visually indicated, for example, by color coding and shape variations using yellow dots. In addition, the gas flow can be effectively informed by increasing or decreasing the motion speed of the dots according to the settings of the flow controller 5.

The above-described determination is performed in a state where gas does not flow yet. If the flow control unit 43 sends a gas flow command to the electromagnetic valve 2 or the flow controller 5, the color of pipe sections color-coded by the determination program is changed from yellow to red to indicate the state of gas filling. Owing to this change, actual state gas filling and gas flow state can be indicated.

Figure 7:
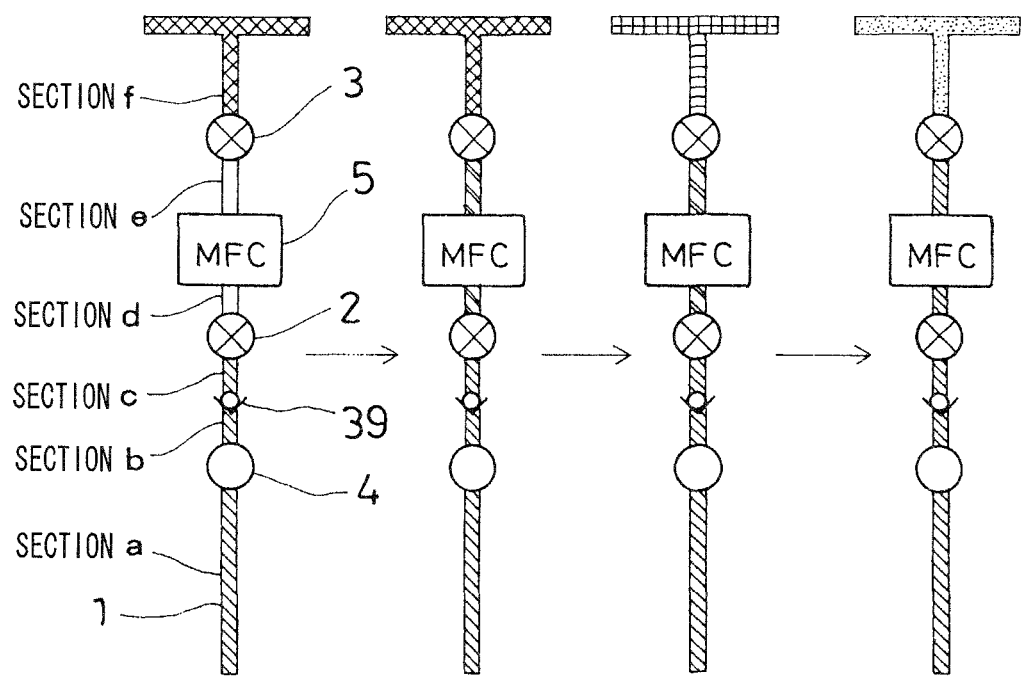
FIG. 7 is a diagram illustrating a display example according to a third embodiment of the present invention.

Next, with reference to FIG. 7, a third embodiment of the present invention will be described. In FIG. 7, the same elements as those illustrated in FIG. 2 will be denoted by the same reference numerals, and descriptions thereof will not be repeated.

The structure of the third embodiment is equal to the structure of the second embodiment.

First, gas is filled in sections (b) and (c) through a section (a) and a regulator 4, and the sections (a), (b), and (c) are indicated by a color, for example, red.

In the case where a substrate processing process is performed by using a mixture of two types of gases, if a section (f) is filled with gas (different from that supplied to the process chamber 34 through a gas pipe 1) such as $N_2$ gas, the section (f) is indicated differently as compared with the first embodiment. For example, the section (f) is color-coded with blue.

In the current embodiment, since inert gas makes no problems although it is mixed with process gas, procedures for representing the section (f) are not explained. In addition, it may be unnecessary to perform simulation for inert gas as described in the current embodiment; however, preferably, simulation may be performed for inert gas according to the present invention.

So as to supply gas to the process chamber 34, an opening request command is sent from the flow control unit 43 to a gas supply electromagnetic valve 2 to open the gas supply electromagnetic valve 2 of the gas pipe 1.

The determination program provided in the flow control unit 43 is executed to determine whether gas is filled in the front side of the electromagnetic valve 2 to be opened. If it is determined that gas is filled, the flow control unit 43 outputs a simulation result to the manipulation unit 44 equipped with indication unit so as to indicate a section (d) by using a color different from a color used to indicate sections (a), (b), and (c), for example, by using yellow. If it is determined that gas is not filled, the pipe color of the section (d) is not changed, for example, from gray.

The determination program is executed in the same way for the front and rear pipe sections of the flow controller 5. If the flow control unit 43 sends a flow command to the flow controller 5 to make the flow of the gas pipe 1 become a predetermined valve, the flow control unit 43 sends a simulation result to the manipulation unit 44 equipped with indication unit so as to display the front and rear pipe sections of the flow controller 5 with a color and motion different from those used for displaying the sections (a), (b), and (c).

If an opening/closing request command is sent to an interlock electromagnetic valve 3, the determination program determines whether gas is filled in a section (e). If it is determined that gas is filled in the section (e), the section (f) is indicated by a color such as green different from the colors used to represent the sections (a), (b), (c), (d), and (e), so as to express a predicted state of mixture gas in the section (f). When the flow control unit 43 sends a gas flow command to the interlock electromagnetic valve 3, a section color-coded by the determination program is changed in color from green to a color indicating a gas mixing state, for example, purple. By this change, it can be indicated whether one type of gas or a mixture of gases flows.

Meanwhile, if an opening request command is generated to open the interlock electromagnetic valve 3, since the type of gas filled in the section (f) can be read from valve opening/closing conditions (signals) of the interlock electromagnetic valve 3, it is possible to determine whether to open the interlock electromagnetic valve 3 to allow mixing of gases.

Figure 9:
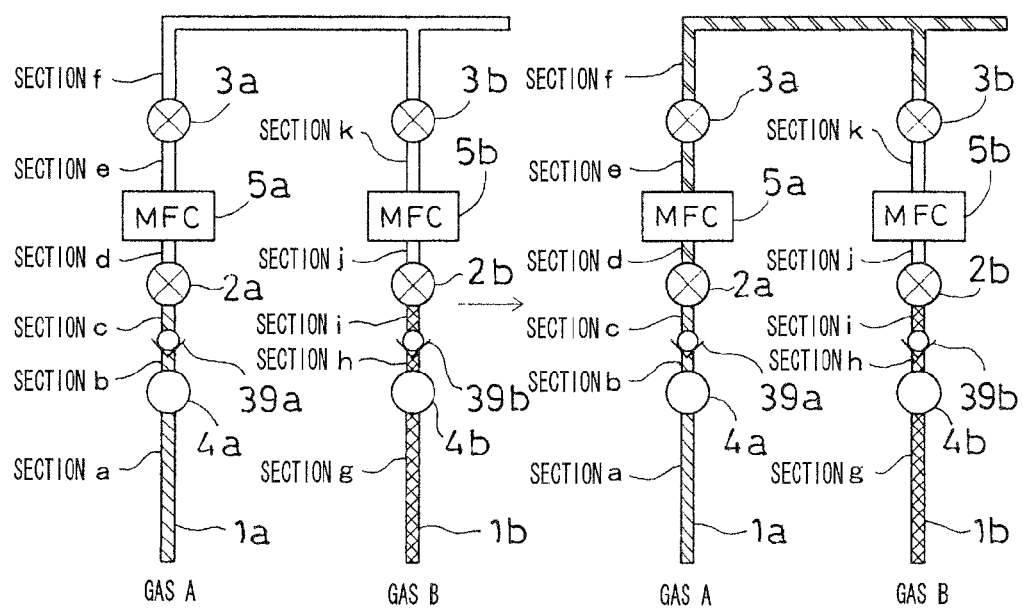
FIG. 9 is a diagram illustrating a display example according to a fourth embodiment of the present invention.

Next, with reference to FIG. 9, a fourth embodiment of the present invention will be described. In FIG. 9, the same elements as those illustrated in FIG. 2 will be denoted by the same reference numerals, and descriptions thereof will not be repeated.

The structure of the fourth embodiment is equal to the structure of the second embodiment, and the fourth embodiment relates to the case where different types of gases A and B are supplied to gas pipes 1a and 1b, respectively.

First, gas A is filled in sections (b) and (c) through a section (a) and a regulator 4a, and the sections (a), (b), and (c) are color-coded by using a color, for example, red; and gas B is filled in sections (h) and (i) through a section (g) and a regulator 4b, and the sections (g), (h), and (i) are color-coded by using a color, for example, blue.

To supply gas A to the process chamber 34, an opening request command is sent from the flow control unit 43 to a gas supply electromagnetic valve 2a installed inside the gas pipe 1a so as to open the gas supply electromagnetic valve 2a.

The determination program provided in the flow control unit 43 is executed to determine whether gas is filled in the front side of the electromagnetic valve 2a to be opened. If it is determined that gas is filled, the flow control unit 43 outputs a signal to the manipulation unit 44 equipped with indication unit so as to indicate a section (d) by using a color different from a color used to indicate sections (a), (b), and (c), for example, by using yellow, and if it is determined that gas is not filled, the pipe color of the section (d) is not changed, for example, from gray.

At the same time, the determination program is executed in the same way for the front and rear pipe sections of a flow controller 5a. When the flow control unit 43 sends a flow command to the flow controller 5a to make the flow of the gas pipe 1a become a predetermined valve, the flow control unit 43 sends a simulation result to the manipulation unit 44 equipped with indication unit so as to indicate the front and rear pipe sections of the flow controller 5a with a color different the color used for indicating the sections (a), (b), and (c). The same determination is performed until the process chamber 34 (a section (f)) is reached, and a predicted gas flow state of the gas pipe 1a is visually indicated, for example, by varying the pipe color from gray to yellow.

Next, in this state, like in the case of the gas pipe 1a, the same opening request command is generated for a gas supply electromagnetic valve 2b, a flow controller 5b, and an interlock electromagnetic valve 3b that are installed in the gas pipe 1b.

If the interlock electromagnetic valve 3b is opened in response to the opening request command, gas A and gas B are mixed at the section (f). Therefore, when the opening request command is generated to open the interlock electromagnetic valve 3b, the manipulation unit 44 equipped with indication unit displays a message that the interlock electromagnetic valve 3b cannot be opened. For example, as shown in FIG. 10, an alert window 44a appears, stating [This valve cannot be opened due to interlock. Please check if a valve that cannot be opened together with this valve is opened.]

Therefore, when a plurality of valves that are dangerous (due to accidents such as fire or explosion of mixed gases) if opened simultaneously are requested to be opened, such possible danger can be informed while indicating a state predicted according to the request.

Figure 11:
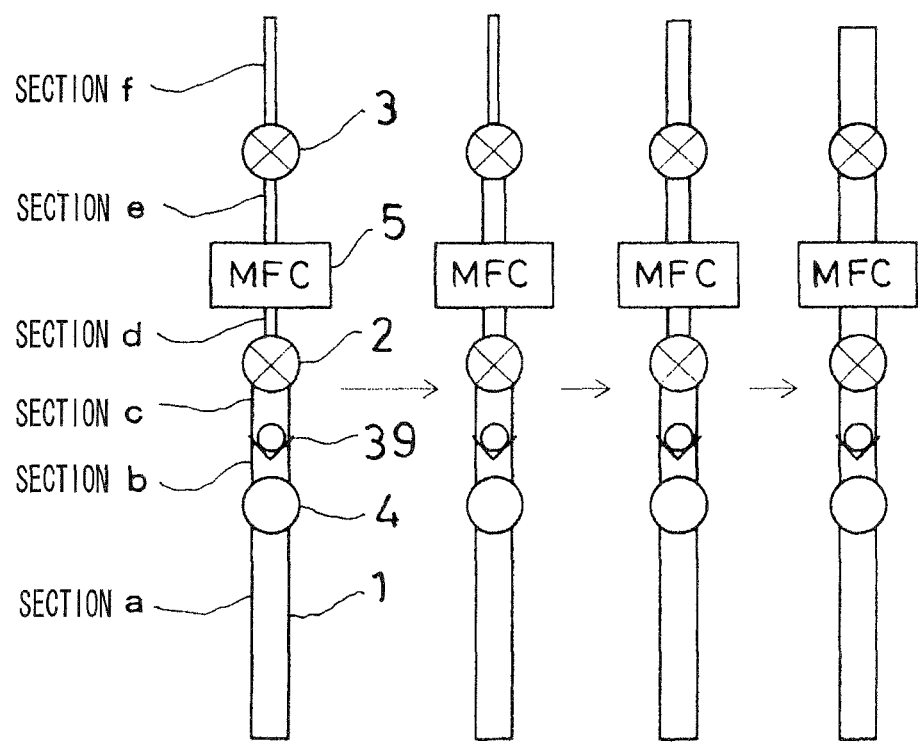
FIG. 11 is a diagram illustrating a display example according to a fifth embodiment of the present invention.

Next, with reference to FIG. 11, a fifth embodiment of the present invention will be described. The structure of the fifth embodiment is equal to the structure of the second embodiment. In FIG. 11, the same elements as those illustrated in FIG. 2 will be denoted by the same reference numerals, and descriptions thereof will not be repeated.

First, gas is filled in sections (b) and (c) through a section (a) and a regulator 4, and the sections (a), (b), and (c) are displayed, for example, with a 4-mm width pipe shape.

To supply gas to the process chamber 34, an opening request command is sent from the flow control unit 43 to a gas supply electromagnetic valve 2 installed inside a gas pipe 1 so as to open the gas supply electromagnetic valve 2.

The determination program provided in the flow control unit 43 is executed to determine whether gas is filled in the front side of the electromagnetic valve 2 to be opened. If it is determined that gas is filled, the manipulation unit 44 equipped with indication unit displays a section (d) with a pipe shape different from that used to display the sections (a), (b), and (c), for example, a 2-mm width pipe shape, and if it is determined that gas is not filled, the pipe shape of the section (d) is not changed, for example, from a 1-mm pipe shape.

At the same time, the determination program is executed in the same way for the front and rear pipe sections of a flow controller 5. When the flow control unit 43 sends a flow command to the flow controller 5 to make the flow of the gas pipe 1 become a predetermined valve, the manipulation unit 44 equipped with indication unit displays the front and rear pipe sections of the flow controller 5 with a pipe shape different that used for indicating the sections (a), (b), and (c) according to simulation results received from the flow control unit 43. The same determination is performed until the process chamber 34 (a section (f)) is reached, and a predicted gas flow state of the gas pipe 1 is visually displayed, for example, by varying the pipe width in the range from 1 mm to 4 mm.

The current embodiment can be combined with other embodiments. For example, the gas state of a pipe can be indicated by varying the shape of the pipe and using color coding or dot marks.

Figure 12:
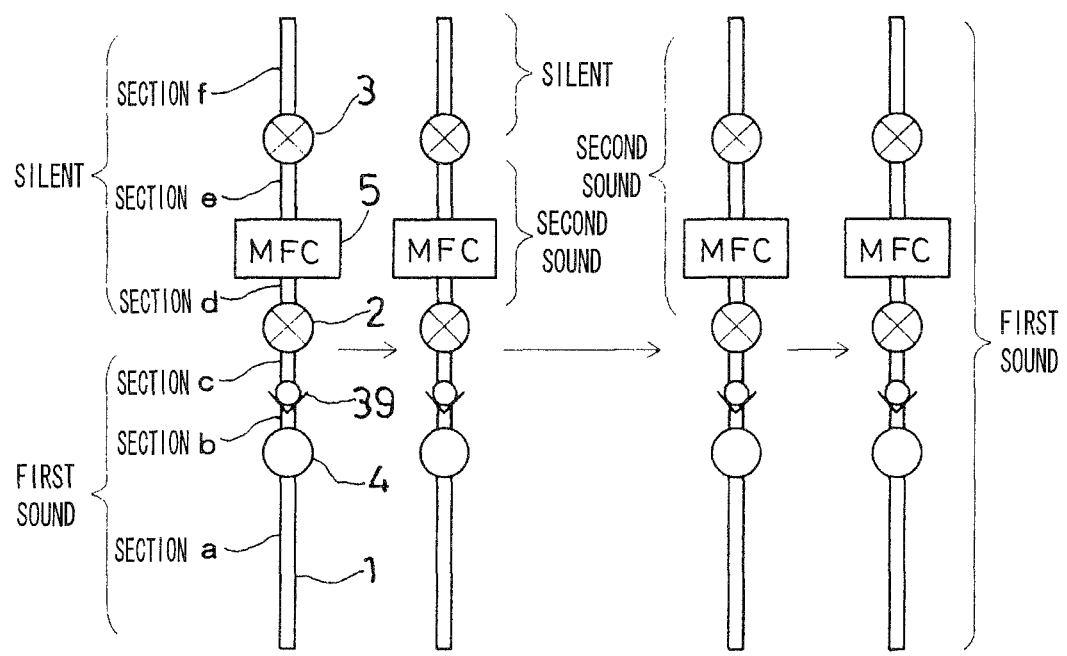
FIG. 12 is a diagram illustrating a sixth embodiment of the present invention.

Next, with reference to FIG. 12, a sixth embodiment of the present invention will be described. The structure of the sixth embodiment is equal to the structure of the second embodiment. In FIG. 12, the same elements as those illustrated in FIG. 2 will be denoted by the same reference numerals, and descriptions thereof will not be repeated.

First, gas is supplied through a section (a) and a regulator 4 so as to fill sections (b) and (c), and an electronic sound such as a first sound "beep-beep-beep" is generated to indicate that the sections (a), (b), and (c) are filled with gas.

To supply gas to the process chamber 34, an opening request command is sent from the flow control unit 43 to a gas supply electromagnetic valve 2 installed inside a gas pipe 1 so as to open the gas supply electromagnetic valve 2.

The determination program provided in the flow control unit 43 is executed to determine whether gas is filled in the front side of the electromagnetic valve 2 to be opened. If it is determined that gas is filled in the front side of the gas supply electromagnetic valve 2, a sound such as a second sound "pip-pip-pip" different from that used for the sections (a), (b), and (c) is generated for a section (d) so as to inform that gas will be filled in response to the opening request command. If it is determined that gas is not filled in the front side of the gas supply electromagnetic valve 2, a sound output for the section (d) is not changed. For example, a silent state indicating that gas is not filled is continued.

At the same time, the determination program is executed in the same way for the front and rear pipe sections of a flow controller 5. When the flow control unit 43 sends a flow command to the flow controller 5 to make the flow become a predetermined valve, the flow control unit 43 generates a sound different from that used for the sections (a), (b), and (c) according to simulation results received from the flow control unit 43 so as to make the front and rear sides of the flow controller 5 distinguishable. The same determination is performed until the process chamber 34 (a section (f)) is reached, and a predicted gas flow state of the gas pipe 1 is aurally expressed by varying audio output among the first sound, the second sound, and the silent state.

The current embodiment can be combined with other embodiments. For example, the state of the gas pipe 1 can be informed more notably by using a visual display method such as color coding, use of dots, shape variations in addition to the auditory method of outputting a sound.

As described above, according to the present invention, when gas is allowed to flow during a recipe preparation or a maintenance work, difficulties of visually and manually checking the gas flow that are caused by complex patterns of fine gas flows can be removed.

In addition, during a recipe preparation, although only a valve is improperly set in a plurality of steps, it is difficult to find the valve. However, according to the present invention, it does not take time to find an improperly set valve, and in each step, it can be visually or aurally ascertained whether desired gas flows according to settings.

Furthermore, it can be prevented that a setup work is delayed due to a process evaluation performed without previously recognizing a setup miss. For example, a useless recipe, which is resulted from a setup miss causing such a case as where necessary gas does not flow, can be avoided.

In the above-described embodiments of the present invention, electromagnetic valves are described. However, instead of electromagnetic valves, air valves can be used. Use of air valves may help to prevent firing of process gas caused by opening and closing operations of electromagnetic valves which are directly installed at a gas pipe. In addition, an electromagnetic valve and an air valve can be connected through an IP pipe. By connecting an electromagnetic valve and an air valve using an IP pipe which is an air tube made of Teflon (trademark), the air valve can be electrically controlled so as to increase process precision. That is, the air valve can be manipulated (opened/closed) through the electromagnetic valve and the air tube by electrically manipulating (opening/closing) the electromagnetic valve so as to control an actual flow of process gas, and thus the flow of process gas can be controlled more precisely.

The present invention described by using the substrate processing apparatus 6 can be applied not only to an apparatus for manufacturing a semiconductor device, but also to an apparatus for processing a glass substrate of a liquid crystal display (LCD). Furthermore, the present invention can be applied not only to a vertical type apparatus but also to a single wafer type apparatus and a transverse type apparatus. In addition, the present invention can be applied in the same way to other substrate processing apparatuses such as an exposing apparatus, a lithography apparatus, and a coating apparatus. In addition, the present invention can be used for processes regardless of whether the processes are in-furnace processes, for example, processes such as oxidation, diffusion, and annealing processes that are not related with chemical vapor deposition (CVD).

According to the present invention, there is provided a substrate processing apparatus including: a state detection unit configured to detect an opening/closing request state and an opening/closing state of a valve installed at a gas pipeline; and a indication unit configured to indicate a gas flow state of the gas pipeline predicted according to the opening/closing request state and a gas flow state of the gas pipeline when the valve is opened, in a way that each state is distinguished. Therefore, the state of the gas pipeline can be checked before an electromagnetic valve is opened, so as to improve safety during a gas flow and reliability in a substrate processing process.

Furthermore, according to the present invention, the substrate processing apparatus further includes a gas detection unit configured to detect gas from an inside of the gas pipeline, and the indication unit is configured to indicate the gas of the gas pipeline detected by the gas detection unit. Therefore, when the state of the gas pipeline is predicted, hazard caused by gas mixing can be avoided, and thus the safety and reliability of a substrate processing process can be improved. In addition, setting mistakes can be reduced during a recipe preparation.

In addition, according to the present invention, the substrate processing apparatus further includes a flow detection unit configured to detect a state of gas flowing through the gas pipeline, and the indication unit is configured to indicate the flow of gas detected by the flow detection unit. Therefore, the present invention is very effective in that even a process requiring fine flow controlling can be easily performed.

(Supplementary Note)

The present invention also includes the following embodiments.

(Supplementary Note 1)

According to a preferred embodiment of the present invention, there is provided a substrate processing apparatus including: a state detection unit configured to detect an opening/closing request state and an opening/closing state of the valve installed at a gas pipeline; and a indication unit configured to indicate a gas flow state of the gas pipeline predicted according to the opening/closing request state and a gas flow state of the gas pipeline when the valve is opened, in a way that each state is distinguished.

(Supplementary Note 2)

The substrate processing apparatus of Supplementary Note 1 further includes a flow detection unit configured to detect a state of gas flowing through the gas pipeline, wherein the indication unit is configured to indicate the flow of gas detected by the flow detection unit.

(Supplementary Note 3)

In the substrate processing apparatus of Supplementary Note 1, the indication unit is configured so that the gas flow state of the gas pipeline predicted according to the opening/closing request state is indicated by using color coding and the gas flow state of the gas pipeline when the valve is opened is indicated by other color coding.

(Supplementary Note 4)

In the substrate processing apparatus of Supplementary Note 1, the indication unit is configured to indicate a state of the gas pipeline by using color coding prepared according to inert gas and hazardous gas.

(Supplementary Note 5)

In the substrate processing apparatus of Supplementary Note 1, the indication unit is configured to indicate a state of the gas pipeline by using color coding prepared according to whether one type of gas or a gas mixture flows.

(Supplementary Note 6)

In the substrate processing apparatus of Supplementary Note 2, the indication unit is configured so that the opening/closing request state of the valve and the flow of the gas pipeline detected by the flow detection unit are indicated by using velocity of moving dots.

(Supplementary Note 7)

In the substrate processing apparatus of Supplementary Note 1, when a plurality of valves are requested to be opened, the indication unit displays an alert window if the valves are dangerous to be simultaneously opened.

(Supplementary Note 8)

In the substrate processing apparatus of Supplementary Note 1, the indication unit is configured so that the gas flow state of the gas pipeline predicted according to the opening/closing request state is indicated by shape variations and the gas flow state of the gas pipeline when the valve is opened is indicated by other shape variations.

(Supplementary Note 9)

In the substrate processing apparatus of Supplementary Note 1, the indication unit is configured so that the gas flow state of the gas pipeline predicted according to the opening/closing request state is indicated by a sound and the gas flow state of the gas pipeline when the valve is opened is indicated by another sound.

What is claimed is:

1. A substrate processing apparatus comprising:
   a control device,
   wherein the control device is configured to:
   detect an opening/closing request state and an opening/closing state of a valve disposed at a gas pipeline;
   perform a simulation for predicting a state of a gas flowing through the gas pipeline by the opening/closing request state of the valve; and
   distinguishably display a state of the gas flowing through the gas pipeline by opening the valve and the state of the gas predicted by the simulation when an open state is detected from the opening/closing request state.

2. The substrate processing apparatus of claim 1, wherein the control device comprises a manipulation unit equipped with an indication unit, the manipulation unit indicating the gas pipeline by a predetermined color representing the state of the gas predicted by the simulation according to the opening/closing request state, and changing a color of the gas pipeline to a predetermined color representing the state of the gas flowing through the gas pipeline by opening the valve when the opening/closing request state is changed to the open state.

3. The substrate processing apparatus of claim 2,
   wherein the control device further comprises a flow control unit including a memory unit storing a determination program for performing the simulation, and
   wherein the manipulation unit detects a type of the gas in the gas pipeline at a front and rear of the valve based on a valve opening/closing condition by executing the determination program.

4. The substrate processing apparatus of claim 3, further comprising:
   a flow detection unit configured to detect a flow rate of the gas flowing through the gas pipeline,
   wherein the flow control unit sends information about a flow detection state including the flow rate to the manipulation unit.

5. The substrate processing apparatus of claim 4, wherein the gas pipeline comprises at least a plurality of pipe elements, and the plurality of pipe elements forms at least a section between the valve and the flow detection unit.

6. The substrate processing apparatus of claim 4, wherein the manipulation unit indicates by a motion speed of dots the flow rate of the gas in the gas pipeline detected by the flow detection unit according to the opening/closing request state.

7. The substrate processing apparatus of claim 4,
   wherein the gas pipeline comprises at least a plurality of pipe elements, and the plurality of pipe elements forms at least a section between the valve and the flow detection unit, and
   wherein the manipulation unit: starts the simulation when the valve is selected and a command signal requesting a valve opening operation is detected; determines whether the valve is in an opening request state, and executes the determination program when the valve is in the opening request state; checks a state of the pipe elements at a front side; and
   checks an opening/closing state of a rear-side valve and a state of the pipe elements at a rear side while determining whether the gas is filled in the pipe elements at the front side.

8. The substrate processing apparatus of claim 7,
   wherein the manipulation unit executes the determination program to determine whether the gas is filled in the pipe elements at the front side,
   wherein the manipulation unit maintains a color of the pipe elements at the rear side as a color representing the gas being not filled in the pipe elements and waits in a standby state until another valve is manipulated when the gas is determined to be not filled in the pipe elements at the front side, and
   wherein the manipulation unit changes the color of the pipe elements at the rear side to a predetermined color representing the gas being predicted to be introduced into the pipe elements when the gas is determined to be filled in the pipe elements at the front side.

9. The substrate processing apparatus of claim 8, wherein the manipulation unit determines whether another valve is manipulated, executes the determination program when another valve is determined to be manipulated, and stops the simulation when another valve is determined to be not manipulated.

10. The substrate processing apparatus of claim 8, wherein the manipulation unit displays a manipulation screen including a cancel button, and the simulation is terminated when the cancel button is pressed during the standby state.

11. The substrate processing apparatus of claim 10, wherein the manipulation screen further includes a SET button, and the manipulation unit determines whether the valve is to be opened according to a press of the SET button.

12. The substrate processing apparatus of claim 11, wherein the flow control unit changes a state of the valve from the opening request state to the open state when the SET button is pressed, and outputs a signal to the manipulation unit to change the color of the pipe elements at the rear side to a predetermined color representing the gas being introduced.

13. The substrate processing apparatus of claim 7, wherein the simulation is performed for each valve.

14. The substrate processing apparatus of claim 2, wherein the manipulation unit indicates a state of the gas pipeline by coded colors representing whether a single type of gas flows in the gas pipeline or a mixture of gases flows in the gas pipeline.

15. The substrate processing apparatus of claim 2, further comprising:
at least one valve,
wherein the manipulation unit displays an alert window when the valve and the at least one valve are to be opened simultaneously according to the opening/closing request state.

16. A non-transitory computer-readable recording medium storing a program to be executed by a substrate processing apparatus, the substrate processing apparatus comprising a control device including a flow control unit having a memory unit storing a determination program for performing a simulation, and a manipulation unit equipped with an indication unit, the manipulation unit being configured to execute the determination program, the program comprising the steps of:
checking a state of pipe elements at a front side;
checking an opening/closing state of a rear-side valve and a state of the pipe elements at a rear side while determining whether a gas is filled in the pipe elements at the front side;
maintaining a color representing the gas being not filled in the pipe elements when the gas is determined to be not filled in the pipe elements at the front side; and
changing a color of the pipe elements at the rear side to a predetermined color representing the gas being predicted to be introduced into the pipe elements when the gas is determined to be filled in the pipe elements at the front side.

17. A substrate processing apparatus comprising:
a control device including a flow control unit having a determination program for performing a simulation, and a manipulation unit equipped with an indication unit, the manipulation unit being configured to execute the determination program,
wherein the control device is configured to:
detect an opening/closing request state and an opening/closing state of a valve disposed at a gas pipeline;
perform a simulation for predicting a state of a gas flowing through the gas pipeline by the opening/closing request state of the valve; and
distinguishably display a state of the gas flowing through the gas pipeline by opening the valve and the state of the gas predicted by the simulation when an open state is detected from the opening/closing request state.

18. A displaying method of a substrate processing apparatus, comprising:
detecting an opening/closing request state and an opening/closing state of a valve disposed at a gas pipeline;
performing a simulation for predicting a state of a gas flowing through the gas pipeline by the opening/closing request state of the valve; and
distinguishably displaying a state of the gas flowing through the gas pipeline by opening the valve and the state of the gas predicted by the simulation when an open state is detected from the opening/closing request state,
wherein the state of the gas predicted by the simulation according to the opening/closing request state is indicated by a predetermined color, and a color indicating the state of the gas is changed from the predetermined color to another predetermined color representing the state of the gas flowing through the gas pipeline by opening the valve when the opening/closing request state is changed to the open state.

* * * * *